United States Patent

Pellerin et al.

[11] Patent Number: 5,432,143
[45] Date of Patent: Jul. 11, 1995

[54] METHOD OF PRODUCING AN $RBA_2CU_3O_y$ MICROCRYSTALLINE STRUCTURE IN WHICH R DENOTES A LANTHANIDE

[75] Inventors: Nadia Pellerin, Orleans La Source; Philippe Odier, St Denis En Val, both of France

[73] Assignee: Alcatel Alsthom Compagnie Generale D'Electricite, Paris, France

[21] Appl. No.: 179,817

[22] Filed: Jan. 11, 1994

Related U.S. Application Data

[63] Continuation of Ser. No. 783,896, Oct. 29, 1991, abandoned.

[30] Foreign Application Priority Data

Oct. 29, 1990 [FR] France .................. 90 13377

[51] Int. Cl.$^6$ ............... C04B 35/45; H01B 12/00
[52] U.S. Cl. .................... 505/450; 505/729; 505/733; 505/126; 505/777; 505/778; 505/779; 505/780; 505/490; 423/593; 423/635; 423/263; 501/123; 501/152
[58] Field of Search ............ 505/733, 729, 126, 777, 505/778, 779, 780; 423/593, 635, 263; 501/123, 152

[56] References Cited

U.S. PATENT DOCUMENTS 5,079,220  1/1992  Lechter et al. .................. 505/1

FOREIGN PATENT DOCUMENTS

| | | |
|---|---|---|
| 0304076 | 8/1988 | European Pat. Off. . |
| 0305179 | 8/1988 | European Pat. Off. . |
| 0319807 | 11/1988 | European Pat. Off. . |
| 0344812 | 6/1989 | European Pat. Off. . |
| 0349444 | 6/1989 | European Pat. Off. . |
| 0356352 | 6/1989 | European Pat. Off. . |

OTHER PUBLICATIONS

Japanese Abstracts, C0778-14522 & JPA 2-217352, Aug. 30, 1990.

*Primary Examiner*—Mark L. Bell
*Attorney, Agent, or Firm*—Sughrue, Mion, Zinn, Macpeak & Seas

[57] ABSTRACT

A method of producing a microcrystalline $RBa_2Cu_3O_y$ structure where R denotes a lanthanide chosen from Y, La, Nd, Sm, Eu, Gd, Tb, Ho, Er, Tm, Yb and Lu and where y has a value between 6.9 and 7 starts with a powder of composition $[x(123); (1-x)(7BaO—18CuO)]$ where (123) denotes the 123 phase of $RBaB_2Cu_3O_y$ and where the value of x is between 0.01 and 1. The powder is compressed and sintered at a temperature below 920° C. (the $BaCuO_2$ and CuO binary eutectic temperature) to form a sample. The sample is placed on an oxide of the lanthanide R. The sample and its support undergo heat treatment enabling chemical reaction between the liquid part of the sample and its support whereby substantially all of the liquid part is consumed and highly regular 123 monocrystals are obtained. Cooling is applied. At least one annealing is carried out in pure oxygen at a temperature between 350° C. and 500° C. to obtain the orthorhombic form characteristic of $RBa_2Cu_3O_y$.

10 Claims, 1 Drawing Sheet

20μm

20μm

METHOD OF PRODUCING AN RBA2CU3Oy MICROCRYSTALLINE STRUCTURE IN WHICH R DENOTES A LANTHANIDE

This is a continuation of application No. 07/783,896 filed Oct. 29, 1991, now abandoned.

BACKGROUND OF THE INVENTION

1. Field of the Invention

The present invention concerns a method of producing an $RBa_2Cu_3O_y$ microcrystalline powder structure in which R denotes a lanthanide chosen from Y, La, Nd, Sm, Eu, Gd, Tb, Ho, Er, Tm, Yb and Lu and the value of Y is between 6.9 and 7.

2. Description of the Prior Art

Expansion of the field of application of superconductive ceramics is currently limited by our inability to produce materials with a high critical current density with reproducible electrical properties. According to the article "High Critical Current Density in Neutron Irradiated Bulk $YBa_2Cu_3O_7$" published in Modern Physics Letters B, 4 (11), 703 (1990), values of a few $10^5$ $Acm^{-2}$ have recently been achieved for textured and then irradiated materials although the critical transport current for polycrystalline ceramics remains limited to $1 \times 10^3 Acm^{-2}$. This value is very far removed from the expected value.

Intergranular phenomena and the microstructure have a decisive role. It seems from the publication "Grain size dependence of the critical current density in $YBa_2Cu_3O_x$" Appl. Phys. Lett. 55(26) 2781 (1989) that the critical current density is optimal for ceramics with a particle size between 1 and 2 $\mu m$; this could be related to microcracking or to residual stresses as indicated in the publications "Microcracking in polycrystalline $YBa_2Cu_3O_{7-x}$", ICMC 90, Garmisch-Partenkirchen, Germany and "Demonstration of Grain Growth induced Microcracking and its Role in the Electrical Response of $YBa_2Cu_3O_{7-x}$", J. Eur. Ceram Soc. 5, 81-85 (1989).

It has further been established that the nature and the chemical composition of the grain interfaces are crucial to achieving intergrain coupling, as indicated in the following articles in particular:

"Superconducting Transport Properties of Grain Boundaries in $YBa_2Cu_3O_7$", Phys. Rev. B 41, 4038 (1990), "Evidence for local composition variations within $YBa_2Cu_3O_{7-x}$ Grain Boundaries", Appl. Phys. Lett. 55(4) 393 (1989).

Two important conclusions can be drawn from the current state of the art.

The first is that the main source of mechanical stresses in YBaCuO ceramics is the anisotropic coefficient of thermal expansion. Differential shrinkage on cooling causes stresses that can exceed the rupture strength and contribute to microcracking. This problem could be remedied by using particles of very regular dimensions (plates or disks, for example) stacked according to their morphology.

The second is that the use of microcrystalline YBaCuO disks is a priori favorable to obtaining oriented or even textured ceramics.

The major technical problem to be solved is that of obtaining microcrystal powders with the required particle size properties.

K. DEMBINSKI, M. GERVAIS, P. ODIER and J. P. COUTURES in the publication "A non Polluting Single Crystal Growth Process for YBaCuO and Phase Diagram related to", E-MRS 90, March 1990, have given the essential characteristics of the $Y_2O_3$—BaO—CuO phase diagram and in particular those of the 123/7BaO—18CuO section. According to this article, compositions between A [0.08(123)—0.92 (7BaO—18CuO ] and B [0.70(123)—0.3 (7BaO—18CuO ] are heated to temperatures between 930° C. and 980° C.

The 123 phase is formed in the presence of a liquid. The state of the art in respect of other materials suggests that there should occur in this liquid a "disolution-reprecipitation" phenomenon whose result should be the formation of microcrystals of the 123 phase trapped in a matrix resulting from the crystallized flux.

An object of the present invention is to propose a method of obtaining these microcrystals powders by flux extraction, this method being adapted to yield well oriented microcrystals.

SUMMARY OF THE INVENTION

The present invention consists in a method of producing microcrystalline $RBa2Cu_3O_y$ powder structure where R denotes a lanthanide chosen from Y, La, Nd, Sm, Eu, Gd, Tb, Ho, Er, Tm, Yb and Lu and where Y has a value between 6.9 and 7, the method comprising the following phases:

starting with a powder of composition:

[x(123) ; (1−x) (7BaO-18CuO ] where (123) denotes the 123 phase of $RBa_2Cu_3O_y$ and where the value of X is between 0.01 and 1, the powder is compressed and sintered at a temperature below 920° C. (the $BaCuO_2$ and CuO binary eutectic temperature) to form a sample, said sample is placed on an oxide of said lanthanide R, the sample and its support undergo heat treatment enabling chemical reaction between the liquid part of said sample and its support whereby substantially all of said liquid part is consumed and highly regular 123 monocrystals are obtained, cooling is applied, at least one annealing is carried out in pure oxygen at a temperature between 350° C. and 500° C. to obtain the orthorhombic form characteristic of $RBa_2Cu_3O_y$.

(The temperature of the $BaCuO_2$ and CuO binary eutectic corresponds to the point $e_2$ in the aforementioned article by Dembinski et al).

Two phenomena are operative in the establishing of the microstructure:

An increase in the initial particle size through the action of a liquid phase which yields parallelepiped-shape plates.

Extraction of the liquid by wettability on the lanthanide oxide support.

In an improved method:

two lanthanide oxide support plates are provided for said sample, said sample is disposed between said supports, during said heat treatment, a pressure in the order of at least ten Pascals is applied between said supports, said microcrystals being then oriented perpendicularly to the direction of the pressure force.

It is then possible to produce strongly oriented or even textured superconductive ceramics.

During said heat treatment said samples and their supports are heated to an initial temperature $T_i$ and then to a final temperature $T_f$ greater than or equal to $T_i$ in a time t between a few minutes and hours such as to 60 hours; the temperature range $T_i$ through $T_f$ is between 920° C. and the temperature at which the 211 phase ($R_2BaCuO_5$) appears.

It is possible to extend the heat treatment at the temperature $T_i$ near the softening temperature if it is required to modify the shape of the plates which are then progressively rounded to form disks as a result of minimizing their free energy.

In one embodiment of the method, the heat treatment is effected in pure oxygen or with a low oxygen partial pressure.

In another embodiment of the method in accordance with the invention, the cooling after said heat treatment is limited to the temperature chosen for annealing.

In a preferred embodiment of the method, the lanthanide is yttrium, the value of x is between 0.25 and 0.7 and the rate at which the temperature is increased between Ti and Tf is between 0.5° C. and 10° C. per hour.

Continuous implementation of the method in accordance with the invention is feasible for large samples by area annealing on a large lanthanide oxide support.

Other features and advantages of the present invention will emerge from the following description of embodiments thereof given by way of non-limiting illustrative example only.

Figure 1:
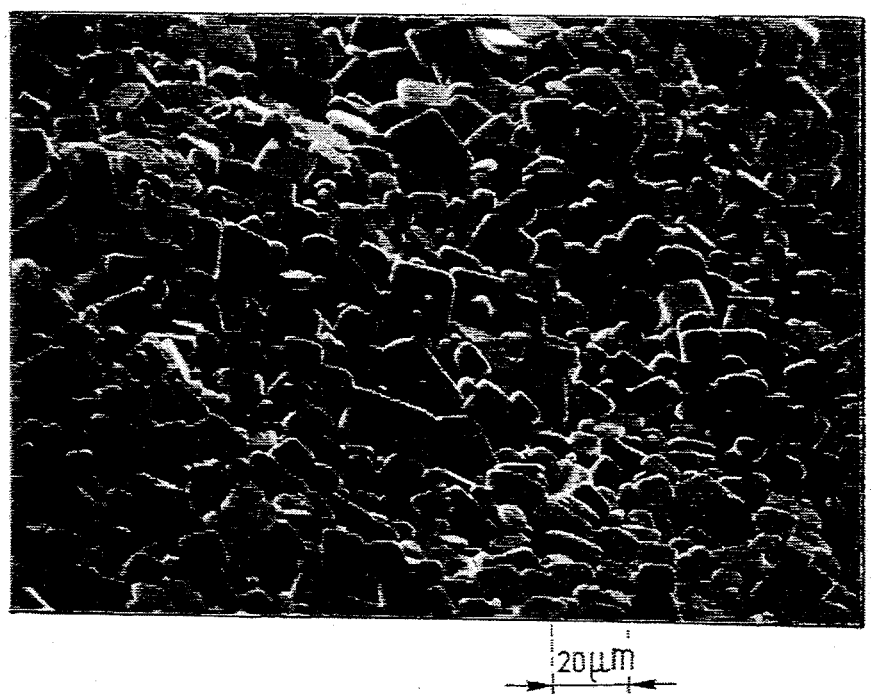
FIGS. 1 and 2 are photographs of two samples containing $YBa_2Cu_3O_y$ microcrystals obtained using the method in accordance with the invention.

First of all, a number of samples are prepared as follows:

Powders of composition [x(123)—(1−x)(7BaO-18CuO)] with $0.25 \leq X \leq 0.7$ are produced using a sol-gel method (polyacrylamide gel) which secures a very homogeneous distribution of the 123, $BaCuO_2$ (011) and CuO (001) phases characterizing this mixture. The article by A. DOUY and P. ODIER "The polyacrylamide Gel—A Novel Route to Ceramic and Glassy Oxide Powders", Mat. Res. Bull 24, 1119-1126 (1989) and French patent FR-A-8803371 describes how to carry out a method of this kind.

Two or three annealings in air each carried out after grinding of the powder (preferably in an agate mortar) are usually required. Annealing must be carried out at progressively increasing temperatures between 750° C. and 900° C. to enable total elimination of the barium carbonate.

Cylindrical samples prepared by uniaxial pressing the powder at 300 MPa and then machining the samples to a diameter of 5 mm and exactly the same height. These samples are sintered in an isothermal cycle of eight hours duration at 900° C. in a flow of oxygen.

Supports are prepared for these samples. They are 15 mm diameter disks 2 mm thick of yttrium oxide sintered at 1 850° C. in a zirconium oven, for example. A very pure powder is used, for example Rhône-Poulenc 99.99% powder. Supports are used as such and with the surface polished to 2 μm.

The heat treatment is described below. The aforementioned cylindrical samples are disposed at the center of the supports. The combination is placed in an aluminum cradle to protect the oven from the evacuated liquid. These experiments are conducted in air in a programmable horizontal oven whose temperature is monitored by a thermocouple a few millimeters from the sample to obtain a reliable temperature measurement.

The sample and its support are heated to an initial temperature $T_i$ in two hours and then to a final temperature $T_f \geq T_i$ in a time t between a few minutes and several tens of hours such as to 60 hours. In some cases the cycle is equivalent to a constant temperature "plateau" at $T_f = T_i$.

The samples are then cooled for three hours or by air quenching in a few minutes.

First of all a temperature $T_f$ below or equal to 935° C. is chosen. A plateau at $T_f$ with a duration between 15 minutes and 15 hours may be used, or a slow increase in temperature between $T_i = 920°$ C. and $T_f$ at a rate between 0.6° C./h and 2° C./h. In both cases slight deformation of the samples is observed and the rapid formation of monocrystals from 930° C., in the form of parallelepiped-shape plates with a lateral dimension of up to 10 μm. The liquid phase is not or only slightly removed from the samples, however.

A temperature $T_f$ above 935° C. is then chosen. If an insufficient time for the plateau at $T_f$ is chosen or if a dynamic temperature increase profile is used and a rate of increase below 5° C./h from 920° C., the following changes are observed: the samples are slightly deformed; significant expulsion of the liquid phase is observed, which wets the supports. The surface of the samples is paved with microcrystals of the 123 phase in the form of plates with rounded corners and dimensions up to 20 μm. They are clean and their sizes cover a narrow range. They are significantly thicker than in the previous case, the lateral dimension/thickness ratio being up to 0.3. The plates are present everywhere within the samples, carpeting numerous and large porosities.

At the end of the treatment nearly all of the flux has been eliminated. X-ray diffraction gives an estimate of 2% residual $BaCuO_2$ phase, the CuO phase being undetectable.

EXAMPLE I (see FIG. 1)

For this sample x=0.25: the heat treatment was carried out between $T_i$ 920° C. and $T_f = 950°$ C. with a rate of increase of 2° C./h with no plateau at Tf.

Plates with rounded corners were seen.

Figure 2:
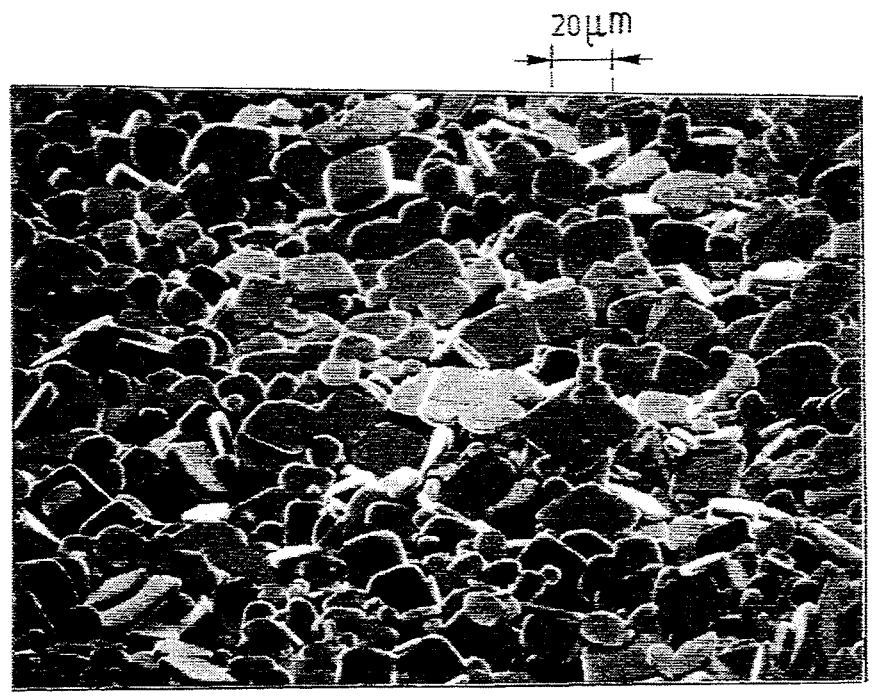

EXAMPLE II (see FIG. 2)

For this sample x=0.33; the heat treatment was carried out at $T_f = 947°$ C. with a plateau of eight hours. Plates were observed similar to those of example I.

The results obtained were practically unchanged for values of X between 0.25 and 0.7.

The photographs show the structure at the surface of the sample, but the internal structure is similar.

Table 1 below gives the morphological characteristics of one sample on a polished yttrium oxide support and another sample on an unpolished yttrium oxide support. Mean values are show for a (lateral dimension), l (thickness) of the plates and the ratio l/a and for σ, the mean standard deviation for a.

TABLE 1

| Support | $\overline{a}$ (μm) | $\overline{\sigma}$ (μm) | $\overline{l/a}$ | Shape |
|---|---|---|---|---|
| Unpolished $Y_2O_3$ | 11 | 4 | 0.3 | |
| Polished $Y_2O_3$ | 16 | 6 | 0.3 | |

Table 2 below gives characteristics of samples on $Y_2O_3$ supports after different heat treatments.

TABLE 2

| Heat Treatment | $\bar{a}$ ($\mu$m) | $\sigma$ ($\mu$m) |
| --- | --- | --- |
| Plateau of 5 h at 936° C. | 13 | 5 |
| Plateau of 60 h at 936° C. | 13 | 3 |
| Plateau of 15 h at 940° C. | 12 | 4 |
| Plateau of 15 h at 946° C. | 18 | 7 |
| Increase from 915° C. to 950° C. at 2.3° C./h, no plateau | 17 | 8 |
| Increase from 915° C. to 942° C. at 0.9° C./h, no plateau | 18 | 6 |

To obtain a highly pure product preference should be given to heat treatment at a high temperature $T_f$, this temperature being below the softening temperature. The liquid phase is then extracted more efficiently.

To obtain large plates a slow rate of increase in temperature should preferably be used.

In all cases the microcrystal powders produced in air are weakly orthorhombic. After annealing in oxygen at 60° C. followed by a plateau at 450° C. they assume the orthorhombic shape characteristic of $YBa_2Cu_3O_{6.9}$.

A number of successive annealings may be necessary.

In one embodiment of the method the same samples are used as previously and inserted between two yttrium oxide supports. Slight pressure (of at least ten pascals) is applied to them. This favors the removal of the liquid phase and helps to orient the microcrystals perpendicularly to the direction of the pressure force.

Under these conditions the X-ray diffraction spectrum after the experiment shows reflections only for the (001) phase, proving a high degree of orientation. The samples are annealed after the treatment.

Of course, the invention is not limited to the embodiments described above. Any means may be replaced by equivalent means without departing from the scope of the invention.

There is claimed:

1. Method of producing a microcrystalline $RBa_2Cu_3O_y$ powder structure where R is selected from the group consisting of Y, La, Nd, Sm, Eu, Gd, Tb, Ho, Er, Tm, Yb and Lu and where y has a value of between 6.9 and 7, said method comprising the following steps:
   providing a powder of a composition:
   x(123) and (1−x)(7BaO—18CuO), where (123) denotes the 123 phase of $RBa_2Cu_3O_y$ and where the value of x is between 0.01 and 1,
   compressing the powder to form a sample and sintering the sample at a temperature below 920° C., the $BaCuO_2$ and CuO binary eutectic temperature,
   placing said sample on a reactive support of $R_2O_3$ where R in $R_2O_3$ of the support is the same as the R of the powder,
   heat treating the sample above 920° C. to form, from said sample, a liquid phase which reacts with the $R_2O_3$ of said support, whereby substantially all of said liquid is consumed, thereby obtaining highly regular (123) powder monocrystals,
   cooling said sample,
   and carrying out at least one annealing of said sample in the presence of oxygen at a temperature of between 350° C. and 500° C. to obtain an orthorhombic form characteristic of $RBa_2Cu_3O_y$.

2. Method according to claim 1, wherein said heat treatment comprises slowly heating the sample and the support to a temperature larger than 920° C. and maintaining the sample and support at that temperature for a time of between two hours and 60 hours.

3. Method according to claim 1, wherein said heat treatment is carried out in pure oxygen or at a low oxygen partial pressure.

4. Method according to claim 1, wherein said cooling step is halted when the annealing temperature is reached.

5. Method according to claim 1, wherein said annealing step is carried out continuously by area annealing said sample on said support.

6. Method according to claim 1, wherein said heat treatment comprises slowly heating the sample and the support to an initial temperature $T_i$ greater than 920° C. and then to a final temperature $T_f$ greater than $T_i$ to 950° C. for a time at $T_f$ of between a few minutes and 24.4 hours.

7. Method of producing a microcrystalline $YBa_2Cu_3O_y$ powder structure where y has a value of between 6.9 and 7, said method comprising the following steps:
   providing a powder of a composition x(123) and (1−x) (7BaO—18CuO), where (123) denotes the (123) phase of $YBa_2Cu_3O_y$ and the value of x is between 0.01 and 1,
   compressing the powder to form a sample and sintering the sample at a temperature below 920° C., the $BaCuO_2$ and CuO binary eutectic temperature,
   placing said sample on a support of pure yttrium oxide $Y_2O_3$,
   heat treating the sample and said support above 920° C. to form, from said sample, a liquid phase which reacts with the yttrium oxide of said support, whereby substantially all of said liquid is consumed, thereby obtaining highly regular (123) powder microcrystals,
   cooling said sample,
   and carrying out at least one annealing of said sample in the presence of oxygen at a temperature between 350° C. and 500° C. to obtain an orthorhombic form characteristic of $YBa_2Cu_3O_y$.

8. Method according to claim 7, wherein the value of x is between 0.25 and 0.7.

9. Method according to claim 7, wherein said heat treatment comprises slowly heating the sample and the support to an initial temperature $T_i$ greater than 920° C. and then to a final temperature $T_f$ greater than $T_i$ to 950° C. for a time at $T_f$ of between a few minutes and 24.4 hours, and wherein the temperature is increased between $T_i$ and $T_f$ during heat treatment at a rate between 0.5° C. and 10° C. per hour.

10. Method of producing a microcrystalline $RBa_2Cu_3O_y$ powder structure where R is selected from the group consisting of Y, La, Nd, Sm, Eu, Gd, Tb, Ho, Er, Tm, Yb and Lu and where y has a value of between 6.9 and 7, said method comprising the following steps:
    providing a powder of a composition:
    x(123) and (1−x)(7BaO—18CuO), where (123) denotes the 123 phase of $RBa_2Cu_3O_y$ and where the value of x is between 0.01 and 1,
    compressing the powder to form a sample and sintering the sample at a temperature below 920° C., the $BaCuO_2$ and CuO binary eutectic temperature,
    placing said sample on a reactive support of $R_2O_3$, where R in $R_2O_3$ of the support is the same as R of the powder,
    heat treating the sample above 920° C. to form, from said sample, a liquid phase which reacts with the $R_2O_3$ of said support, whereby substantially all of said liquid is consumed, thereby obtaining highly regular (123) powder monocrystals, cooling said sample, and carrying out at least one annealing of said sample in the presence of oxygen at a temperature of between 350° C. and 500° C. to obtain an orthorhombic form characteristic of $RBa_2Cu_3O_y$, wherein said step of placing said sample on a support comprises placing said sample between two $R_2O_3$ support plates, and said heat treating step comprises applying a pressure of at least 10 Pascals between said supports to effect orientation of said microcrystals of powder perpendicular to the direction of the pressure force.

* * * * *